US006656790B2

(12) United States Patent
Jang et al.

(10) Patent No.: US 6,656,790 B2
(45) Date of Patent: *Dec. 2, 2003

(54) METHOD FOR MANUFACTURING A SEMICONDUCTOR DEVICE INCLUDING STORAGE NODES OF CAPACITOR

(75) Inventors: Se-myeong Jang, Gunpo (KR); Ki-nam Kim, Anyang (KR); Hong-sik Jeong, Suwon (KR); Yoo-sang Hwang, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/078,885

(22) Filed: Feb. 19, 2002

(65) Prior Publication Data

US 2002/0160550 A1 Oct. 31, 2002

(30) Foreign Application Priority Data

Apr. 26, 2001 (KR) .......................................... 2001-22677

(51) Int. Cl.$^7$ .......................................... H01L 21/8242
(52) U.S. Cl. ........................ 438/253; 438/396; 438/398; 438/255
(58) Field of Search ................................. 438/253, 254, 438/255, 396, 397, 398

(56) References Cited

U.S. PATENT DOCUMENTS

| 6,171,926 | B1 | * | 1/2001 | Chun et al. .................. 438/396 |
| 6,458,653 | B1 | * | 10/2002 | Jang ............................ 438/253 |
| 6,482,696 | B2 | * | 11/2002 | Park ............................ 438/253 |
| 6,500,763 | B2 |   | 12/2002 | Kim et al. .................... 438/689 |

FOREIGN PATENT DOCUMENTS

KR      20010056241      4/2001      ......... H01L/27/108

* cited by examiner

Primary Examiner—Tuan H. Nguyen
(74) Attorney, Agent, or Firm—Mills & Onello LLP (57) ABSTRACT

A semiconductor device including storage nodes of a capacitor and a method for manufacturing the same are provided. Bit lines are formed on a semiconductor substrate, and protection layers are formed to cover and protect the bit lines. Conductive contact pads are formed between the bit lines and are level with the top surfaces of the protection layers. A node supporting layer is formed to cover the conductive contact pads and the protection layers. An etching stopper is formed on the node supporting layer. The mold layer, the etching stopper, and the node supporting layer are patterned, thereby forming opening holes exposing the conductive pads. Storage nodes are formed in the opening holes and have the shape of the profile of the opening holes. The mold layer exposed by the storage nodes is removed, thereby exposing the outer wall of each of the storage nodes positioned above the etching stopper.

7 Claims, 6 Drawing Sheets

METHOD FOR MANUFACTURING A SEMICONDUCTOR DEVICE INCLUDING STORAGE NODES OF CAPACITOR

BACKGROUND OF THE INVENTION

1. Field of the Invention

The present invention relates to a semiconductor device and a method for manufacturing the same, and more particularly, to storage nodes of a capacitor, which realize increased effective surface and enhanced mechanical strength, and a method for manufacturing the same.

2. Description of the Related Art

As the integration density of semiconductor devices such as dynamic random access memories (DRAM) increases, patterns become finer. Accordingly, the pitch of each of the storage nodes of capacitors continues to decrease. However, the capacitance required for driving a semiconductor device does not decrease in proportion to a decrease in the design rule of a semiconductor device due to soft errors. As a result, it has been required to increase the capacitance of a capacitor. In particular, a method for increasing the effective surface area of a capacitor storage node by increasing the height of a cylinder type storage node has been proposed.

Figure 1:
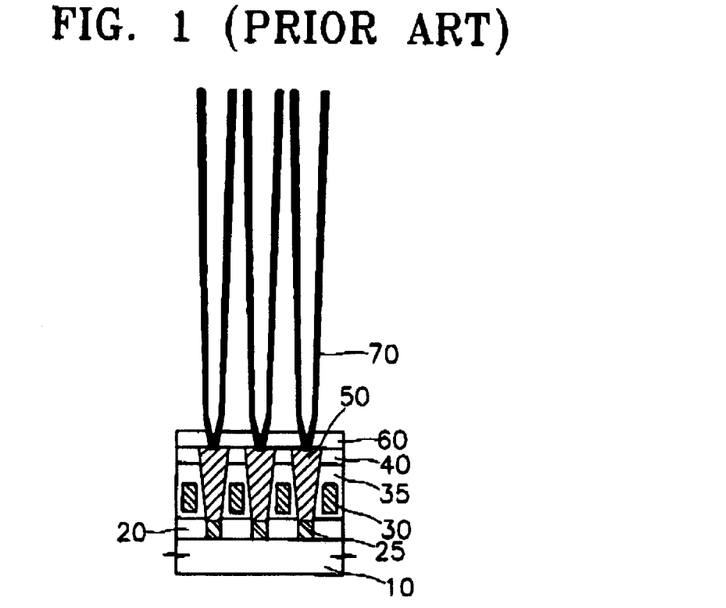
FIG. 1 is a cross-sectional view illustrating a method for manufacturing conventional storage nodes.

FIG. 1 is a cross-sectional view illustrating conventional cylinder type storage nodes. Specifically, bit lines 30 are formed on a semiconductor substrate 10, and an interlayer insulating layer 40 is formed on the bit lines 30 to cover the bit lines 30. Here, each of the bit lines 30 may be covered with a protection layer 35 consisting of a spacer and a capping layer in order to perform a self-aligned contact process for patterning the interlayer insulating layer 40. Next, a buried contact pad 50 is formed through the interlayer insulating layer 40, and cylinder type storage nodes 70 are formed electrically connected to the buried contact pad 50. Here, the buried contact pad 50 may be electrically connected to the semiconductor substrate 10 via conductive plugs 25, and the conductive plugs 25 may be surrounded by a lower insulating layer 20.

The bottom portions of the storage nodes 70 are supported in a lateral direction by an etching stopper 60 used to stop etching of a mold layer (not shown) for forming the storage nodes 70. If the height of each of the storage nodes 70 is increased considerably to obtain a sufficient amount of capacitance, the mechanical strength of the storage nodes 70 decreases. In general, the mechanical strength of the storage nodes 70 decreases in proportion to the cube of the height of each of the storage nodes 70.

Due to the decrease in the mechanical strength of the storage nodes 70, the storage nodes 70 may collapse or tilt to one side. As a result, a bridge may occur between adjacent storage nodes 70. The occurrence of a bridge between the adjacent storage nodes 70 may cause the malfunction of a semiconductor device, such as multi-bit or twin bit failure.

Therefore, in order to ensure a sufficient amount of capacitance by increasing the height of each of the storage nodes 70, it is required to enhance the mechanical strength of the storage nodes 70, which are three-dimensional.

SUMMARY OF THE INVENTION

To solve the above problems, it is an object of the present invention to provide a semiconductor device and a method for manufacturing the same which are capable of preventing storage nodes of a capacitor from collapsing or tilting to one side by increasing the mechanical strength of the storage nodes and simultaneously obtaining a considerable amount of capacitance by increasing the heights of the storage nodes.

Accordingly, the invention is directed to a method for manufacturing a semiconductor device and a semiconductor device. In accordance with the manufacturing method of the invention, bit lines and protection layers for covering each of the bit lines are formed on a semiconductor substrate. Conductive contact pads are formed between the bit lines to a height level with the top surfaces of the protection layers. A node supporting layer is formed covering the conductive contact pads and the protection layers. An etching stopper is formed on the node supporting layer. A mold layer is formed on the etching stopper. Opening holes are formed to expose the conductive contact pads by patterning the mold layer, the etching stopper, and the node supporting layer. Storage nodes are formed in the opening holes, the storage nodes having the shape of the profile of the opening holes. The outer walls of the storage nodes positioned above the etching stopper are exposed by removing the exposed mold layer.

Here, the step of forming the conductive contact pads includes: forming an interlayer insulating layer to fill a gap between the bit lines; patterning the interlayer insulating layer to expose the top surface and side walls of each of the protection layers covering the bit lines; forming a conductive layer to be electrically connected to the semiconductor substrate by filling a gap between the side walls of the protection layers with a conductive material; and sequentially planarizing the conductive layer and the interlayer insulating layer to expose the top surface of each of the protection layers. Accordingly, the interlayer insulating layer covers two facing lateral sides of adjacent conductive contact pads, and each of the protection layers forms the other facing lateral sides of adjacent conductive contact pads. Sequentially planarizing the conductive layer and the interlayer insulating layer can be performed by etch back or chemical mechanical polishing (CMP). In one embodiment, the node supporting layer is formed of silicon oxide.

The thickness of the node supporting layer may account for about 20–40% of the thickness of the mold layer.

The step of removing the mold layer preferably stops at the surface of the etching stopper.

The semiconductor device of the invention includes: bit lines and protection layers for covering the bit lines; conductive contact pads formed between the bit lines and level with the top surface of each of the protection layers; storage nodes connected to the conductive contact pads and having exposed inner and outer walls; and a node supporting layer surrounding the bottom portions of the storage nodes and thus supporting the storage nodes.

According to the present invention, storage nodes of a capacitor are prevented from collapsing or tilting to one side by increasing the mechanical strength of the storage nodes. Also, a considerable amount of capacitance is obtained by increasing the heights of the storage nodes. The thickness of the node supporting layer may account for about 20–40% of the height of each of the storage nodes.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will now be described more fully with reference to the accompanying drawings, in which a preferred embodiment of the invention is shown. This invention may, however, be embodied in many different forms and should not be construed as being limited to the embodiment set forth herein. In the drawings, the thickness of layers and regions are exaggerated for clarity. It will also be understood that when a layer is referred to as being "on" another layer or substrate, it can be directly on the other layer or substrate, or intervening layers may also be present.

Figure 2:
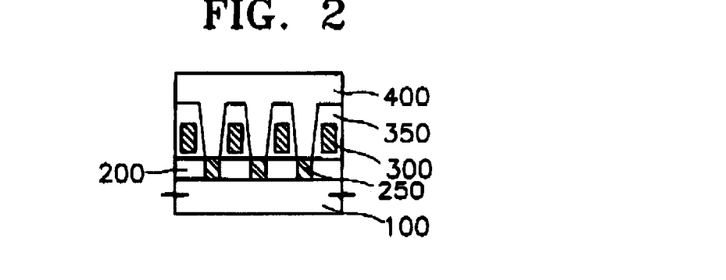
FIGS. 2 through 12 are diagrams illustrating a method for manufacturing a semiconductor device including storage nodes of a capacitor according to the present invention.

FIGS. 2 through 12 are diagrams illustrating a method for manufacturing a semiconductor device including a storage node of a capacitor according to the present invention. Specifically, FIG. 2 is a cross-sectional view illustrating a step of forming bit lines 300 and an interlayer insulating layer 400 on a semiconductor substrate 100. Referring to FIG. 2, an active device, such as a transistor, is formed on the semiconductor substrate 100 using a well-known method. A lower insulating layer 200 is formed of silicon oxide on the semiconductor substrate 100. Then, the lower insulating layer 200 is patterned, and conductive plugs 250 are formed through the lower insulating layer 200 to be electrically connected to the semiconductor substrate 100. The conductive plugs 250 may be formed of a polycrystalline silicon layer.

Next, a conductive layer is formed on the lower insulating layer 200 and is patterned, thereby forming the bit lines 300. Here, a capping insulating layer is formed on the bit lines 300 and a spacer is formed at either sidewall of each of the bit lines 300. That is, each of the bit lines 300 is covered with a protection layer 350 consisting of the spacer and the capping insulating layer in order to prevent the bit lines 300 from being damaged by an etching process for patterning the interlayer insulating layer to be formed later. The protection layer 350 may be formed of an insulating material having a superior etching selectivity to silicon oxide used in the interlayer insulating layer 400, such as silicon nitride.

An insulating material, such as silicon oxide, is deposited, thereby forming the interlayer insulating layer 400 covering and insulating the bit lines 300 and the protection layer 350. Here, the interlayer insulating layer 400 is formed to a sufficient thickness that a gap between the bit lines 300 is sufficiently filled.

Figure 3:
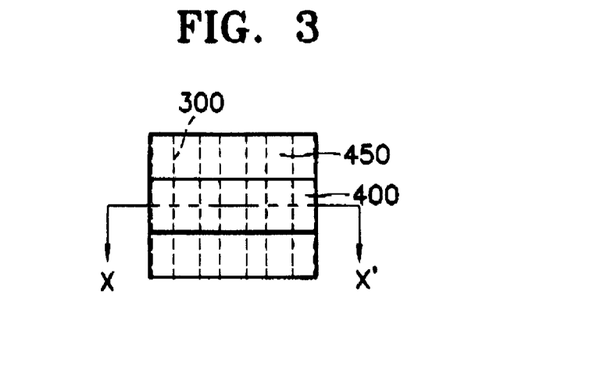

FIG. 3 is a top view illustrating a step of forming a photoresist pattern 450 on the interlayer insulating layer 400. Specifically, an etching mask, such as the photoresist pattern 450, is formed on the interlayer insulating layer 400 for preparing for a process of forming a buried contact. Here, the photoresist pattern 450 exposes portions of the surface of the interlayer insulating layer 400 covering the bit lines 300 and is arranged such that the portions of the interlayer insulating layer 400 exposed by the photoresist pattern 450 are shaped as bands. The photoresist pattern 450 exposes not only the portions of the interlayer insulating layer 400 in which a buried contact will be formed later but also other portions of the interlayer insulating layer 400 which will not be occupied by the buried contact so that the exposed portions of the interlayer insulating layer 400 across from the bit lines 300 become shaped as long bands. The photoresist pattern 450 is formed to obtain sufficient process margins irrespective of the decrease of a design rule in forming a buried contact.

Figure 4:
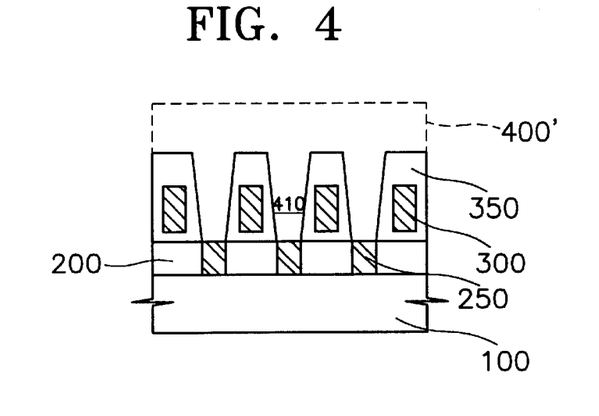

Line X—X' of FIG. 3 indicates where the cross-section shown in FIG. 2 is positioned. FIG. 4 is a cross-sectional view illustrating a step of exposing the conductive plugs 250 between the bit lines 300 by patterning the interlayer insulating layer 400. Specifically, the exposed portions of the interlayer insulating layer 400 are selectively etched using the photoresist pattern 450 shown in FIG. 3 as an etching mask until the conductive plugs 250 between the bit lines 300 are exposed. Since the protection layer 350 for covering and protecting the bit lines 300 is formed of silicon nitride, which has superior etching selectivity to silicon oxide used in forming the interlayer insulating layer 400, the protection layer 350 may serve as an etching mask or an etching stopper. Therefore, damage to the bit lines 300 caused by etching can be prevented, and the interlayer insulating layer 400 can be patterned so that the surface of a lower layer between the bit lines 300, that is, the conductive plugs 250, is exposed.

As a result of patterning the interlayer insulating layer 400, an interlayer insulating layer pattern 400' is formed to have contact holes 410 exposing the conductive plugs 250. The contact holes 410 are used for forming a buried contact. Two opposite sidewalls of a contact hole 410 are formed of portions of the protection layer 350, and the other opposite sides of the contact hole 410 are formed of portions of the interlayer insulating layer pattern 400'. The patterning process for forming the interlayer insulating layer pattern 400' follows an improved self-aligned contact (SAC) process.

Due to the formation of the interlayer insulating layer pattern 400', the top surface or sides of the protection layer 350 covering the bit lines 300 adjacent to the conductive plugs 250 may be exposed. At this time, the protection layer 350 on the bit lines 300 may be exposed. Accordingly, if the contact holes 410 for a buried contact are formed in the above manner, sufficient margins for a process of forming the contact are obtained.

Figure 5:
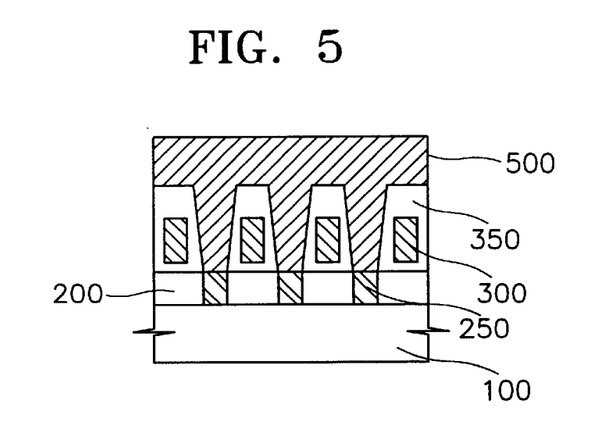

FIG. 5 is cross-sectional view illustrating a step of forming a conductive layer 500 on the interlayer insulating layer pattern 400'. Specifically, the conductive layer 500 is formed on the interlayer insulating layer pattern 400' so as to be electrically connected to the conductive plugs 250 exposed by the contact holes 410. The conductive layer 500 is prepared for forming a buried contact and may be formed of a conductive material, such as polycrystalline silicon. The conductive layer 500 may be formed to a sufficient height so as to completely fill the contact holes, specifically, a height above the interlayer insulating layer pattern 400'.

Figure 6:
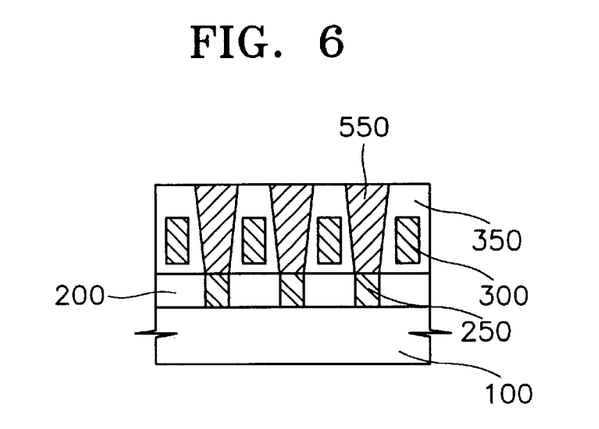

FIG. 6 is a cross-sectional view illustrating a step of forming conductive contact pads 550 between the bit lines 300 by patterning the conductive layer 500. Specifically, the conductive layer 500 is planarized by etch back or chemical mechanical polishing (CMP), thereby forming the conductive contact pads 550. Planarization is then performed until the surface of the conductive contact pads 550 is level with the surface of the protection layer 350 positioned on the bit lines 300. That is, CMP stops at the surface of the protection layer 350, and the conductive layer 500 and a part of the interlayer insulating layer pattern 400' under the conductive layer 500 are polished. After the planarization process, the top surface of the conductive contact pads 550 is substantially level with the top surfaces of the protection layer 350 and the interlayer insulating layer pattern 400'.

Figure 7:
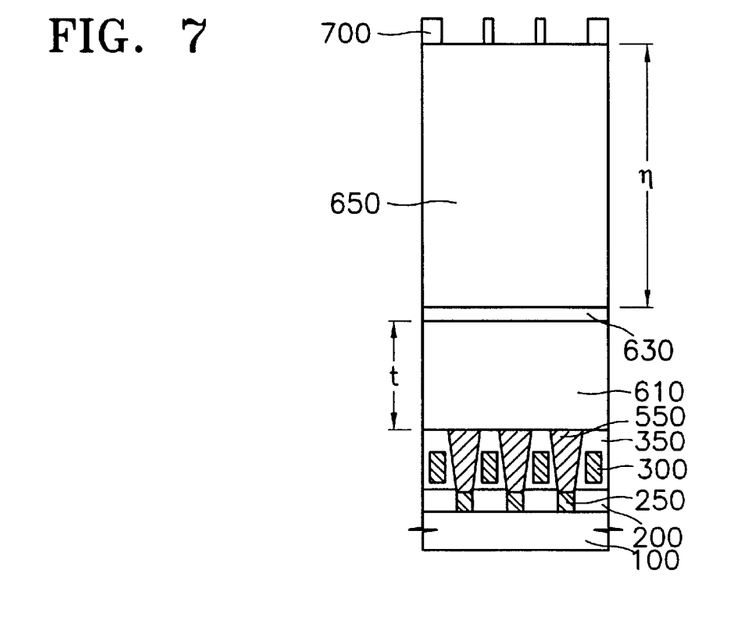

FIG. 7 is a cross-sectional view illustrating a step of forming a mold layer 650 on the exposed conductive contact pads 550 and the protection layer 350. Specifically, a node supporting layer 610 is formed to cover the conductive contact pads 550, the protection layer 350, and the interlayer insulating layer pattern (not shown in FIG. 7) contacting the two facing sidewalls of adjacent conductive contact pads 550. The node supporting layer 610 supports storage nodes to be formed later and electrically connects the storage nodes to the conductive contact pads 550 by surrounding the bottom portions of the storage nodes. Accordingly, the node supporting layer 610 is preferably formed to a sufficient thickness for the storage nodes to have a sufficient mechanical strength. The thickness of the node supporting layer 610 may be varied depending on the height of the storage nodes and may account for 20–40% of the height of each of the storage nodes. For example, in one particular embodiment, the node supporting layer 610 is formed to a thickness "t" of about 5000 Å. The node supporting layer 610 is preferably formed of an insulating material, such as silicon oxide. For example, the node supporting layer 610 may be formed of tetraethylorthosilicate (TEOS) by plasma enhanced chemical vapor deposition (PECVD).

Next, an etching stopper 630 is formed on the node supporting layer 610. The etching stopper 630 may be used as an etching end point in patterning the mold layer 650 and thus is preferably formed of a material having a high etching selectivity to the material of the mold layer 650, i.e., silicon nitride.

Next, the mold layer 650 is formed on the etching stopper 630. The mold layer 650 is introduced in order to form three-dimensional storage nodes and will be removed after the formation of the storage nodes. Thus, the thickness η of the mold layer 650 depends on the height of the storage nodes. For example, in one embodiment, the mold layer 650 is formed to a thickness of about 12,000 Å. The mold layer 650 may be formed to be a TEOS layer formed by PECVD.

Next, an etching mask 700 used for patterning the mold layer 650 is formed on the mold layer 650. The etching mask 700 is preferably formed of a material having a high etching selectivity to the material of the mold layer 650, such as polycrystalline silicon.

Figure 8:
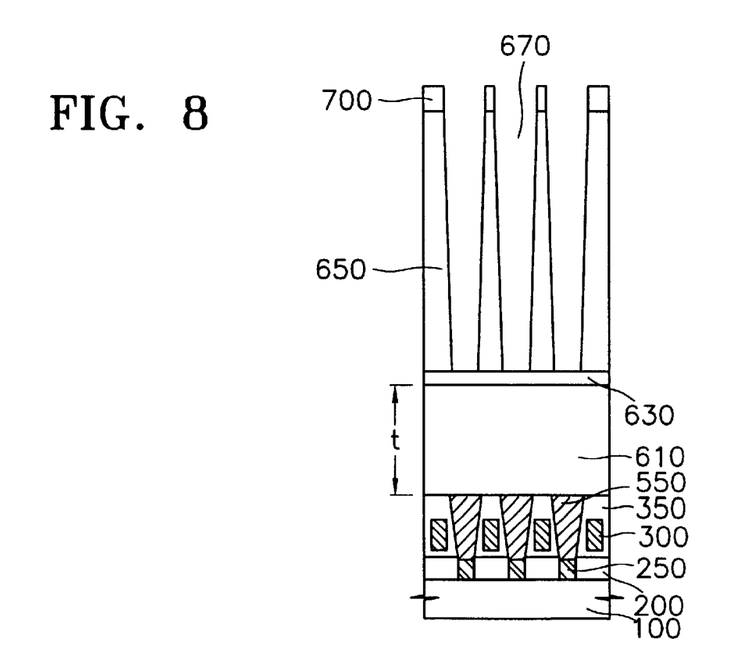

FIG. 8 is a cross-sectional view illustrating a step of forming opening holes 670 by patterning the mold layer 650. Specifically, portions of the mold layer 650 exposed by the etching mask 700 are etched, thereby forming the opening holes 670 in the mold layer 650. In a case where the mold layer 650 is formed of silicon oxide, the opening holes 670 may be formed by a method for dry-etching silicon oxides, such as reactive ion etcher (RIE). At this time, the etching stopper 630 under the mold layer 650 may be exposed by the etching process. That is, the etching process may be finished first on the etching stopper 630.

Figure 9:
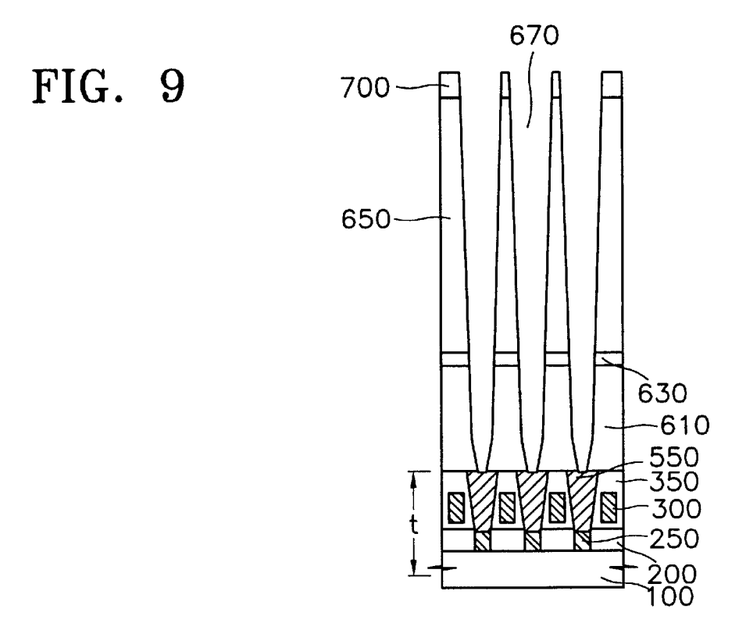

FIG. 9 is a cross-sectional view illustrating a step of making the opening holes 670 expose the conductive contact pads 550 by continuously etching the etching stopper 630 to be removed and the node supporting layer 610 after patterning the mold layer 650. Specifically, after the etching stopper 630 is exposed, the exposed portions of the etching stopper 630 and the node supporting layer 610 are continuously etched. As a result, the top surfaces of the conductive contact pads 550 are exposed by the opening holes 670. Here, the exposed portions of the etching stopper 630 and the node supporting layer 610 may be etched by time etch, until the top surfaces of the conductive contact pads 550 are exposed. As a result, a mold having the opening holes 650 and consisting of the mold layer 650, the etching stopper 630 and the node supporting layers 610 is formed.

Figure 10:
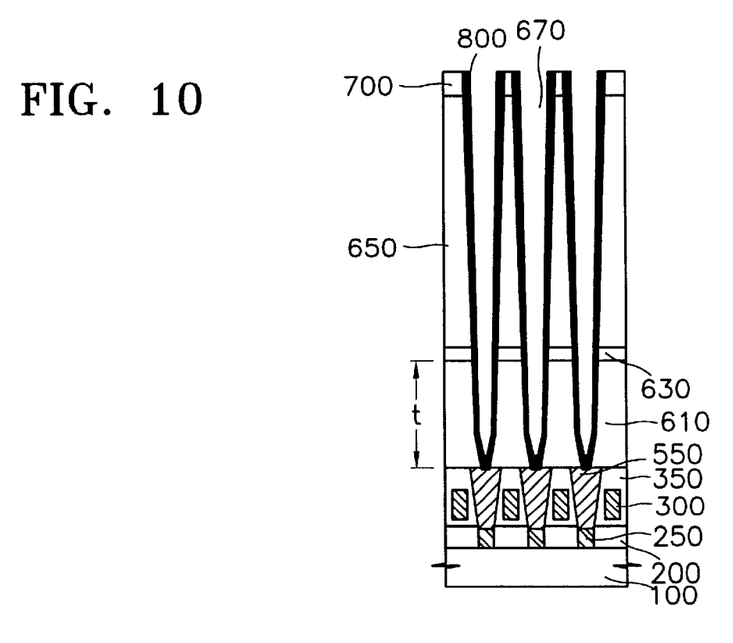

FIG. 10 is a cross-sectional view illustrating a step of forming storage nodes 800 in the opening holes 670. Specifically, a storage node layer is deposited along the profile of the opening holes 670. The storage node layer may be formed of any of a variety of conductive materials. For example, the storage node layer may be formed of conductive polycrystalline silicon.

Next, the storage node is partially etched back or chemically and mechanically polished, thereby separating the storage node layer into the storage nodes 800. Etch-back or a chemical mechanical polishing process is performed until the etching mask 700 positioned under the storage node layer is exposed. Since the storage node layer has been deposited along the profile of the opening holes 670, the storage nodes 800 have a three-dimensional structure.

Figure 11:
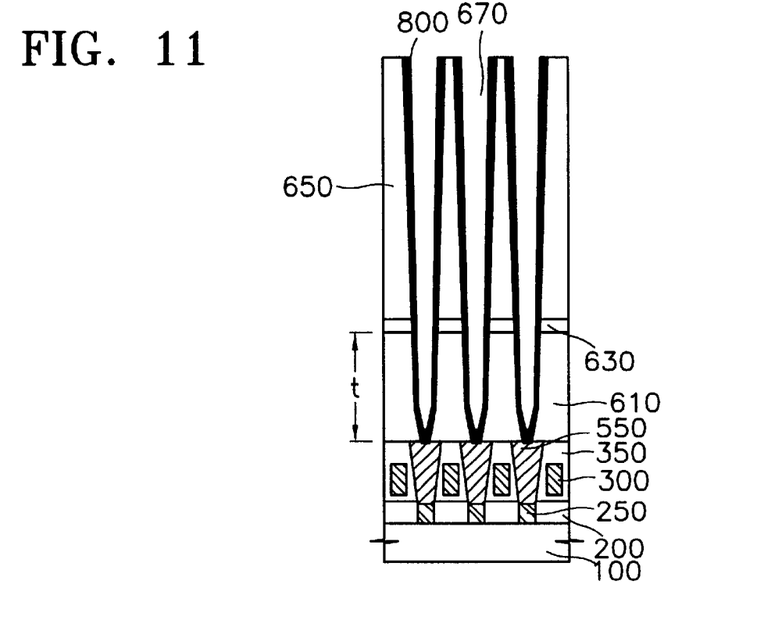

FIG. 11 is a cross-sectional view illustrating a step of removing the etching mask 700. Specifically, the etching mask 700 exposed by the storage nodes 800 is removed by a lift off method.

Figure 12:
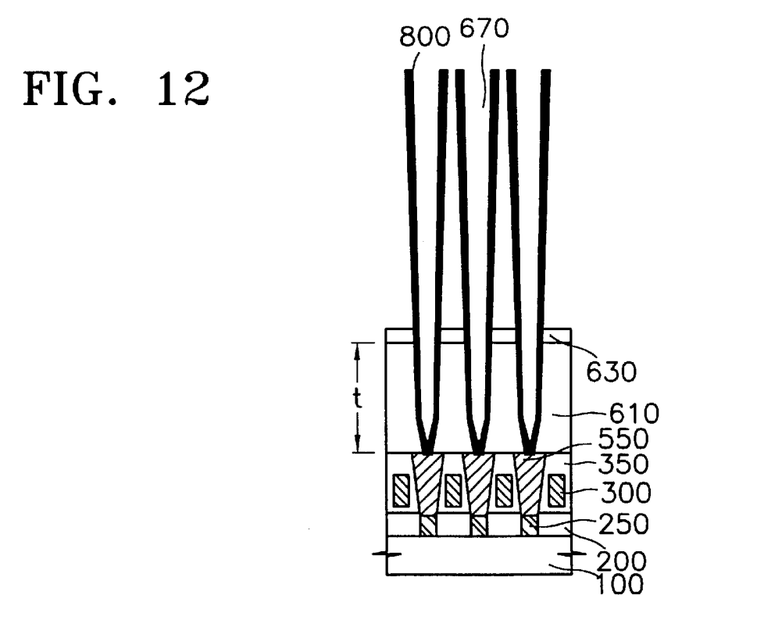

FIG. 12 is a cross-sectional view illustrating a step of exposing the outer wall of each of the storage nodes 800 by removing the mold layer 650. Specifically, the mold layer 650 is selectively removed by wet etching using an etchant including HF. Since the etching process stops at the etching stopper 630, the mold layer 650 can be selectively removed. Accordingly, the outer wall of each of the storage nodes 800 is exposed.

The node supporting layer 610 positioned under the etching stopper 630 is not etched in this etching process and still surrounds the bottom portions of the storage nodes 800. Since the node supporting layer 610 surrounds the bottom portions of the storage nodes 800, the mechanical strength of the storage nodes 800 can be ensured. Accordingly, even though the height of the storage nodes 800 increases, it is possible to prevent the storage nodes 800 from collapsing or tilting to one side. Thus, it is possible to prevent occurrence of a bridge between the storage nodes 800 and occurrence of defects, such as multi bit or twin bit failure. Since the surface area of the storage nodes 800 can be increased, the capacitance of a capacitor can be increased. Moreover, the inner wall of each of the storage nodes 800 surrounded by the node supporting layer 610 can contribute to the increase of the effective surface area of a capacitor. Therefore, the capacitance of a capacitor can be increased.

Figure 13:
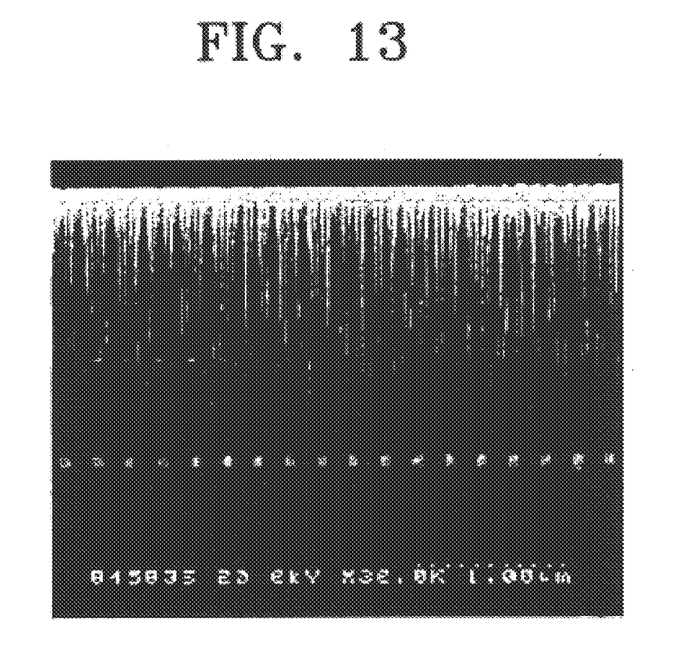
FIG. 13 is a SEM image of storage nodes according to the present invention.

FIG. 13 is a scanning electron microscope (SEM) image of storage nodes according to an embodiment of the present invention. In FIG. 13, there are no storage nodes having defects such as storage nodes which are collapsed or tilted to one side. Here, the node supporting layer is formed to a thickness of about 5000 Å, and the height of each of the storage nodes is about 12,000 Å above the node supporting layer.

Figure 14:
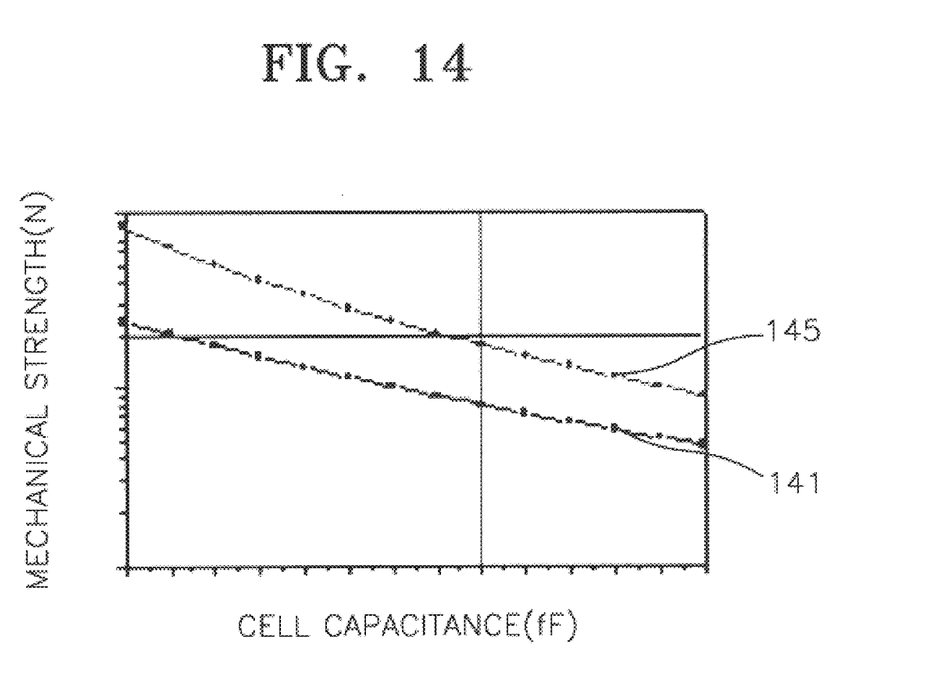
FIG. 14 is a graph showing the mechanical strength of storage nodes illustrating the effects of the present invention.

FIG. 14 is a graph showing the mechanical strength of storage nodes with respect to cell capacitance according to an embodiment of the present invention. Referring to FIG. 14, when cell capacitance is kept at 25fF, a graph line 145 showing the mechanical strength of storage nodes with respect to cell capacitance according to an embodiment of the present invention represents values much higher than in a graph line 141 showing the mechanical strength of conventional storage nodes with respect to cell capacitance. This suggests that the storage nodes according to the present invention can ensure a larger amount of capacitance at a particular mechanical strength level than the conventional storage nodes. Thus, if a capacitor is formed using the storage nodes according to the present invention, a considerable amount of capacitance is also obtained.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a semiconductor device comprising:

forming bit lines and protection layers for covering each of the bit lines on a semiconductor substrate;

forming conductive contact pads between the bit lines to a height level with the top surfaces of the protection layers;

forming a node supporting layer covering the conductive contact pads and the protection layers;

forming an etching stopper on the node supporting layer;

forming a mold layer on the etching stopper;

forming opening holes to expose the conductive contact pads by patterning the mold layer, the etching stopper, and the node supporting layer;

forming storage nodes in the opening holes, the storage nodes having the shape of the profile of the opening holes; and exposing the outer walls of the storage nodes positioned above the etching stopper by removing the exposed mold layer.

2. The method of claim 1, wherein the step of forming the conductive contact pads comprises the steps of:

forming an interlayer insulating layer to fill a gap between the bit lines;

patterning the interlayer insulating layer to expose the top surface and side walls of each of the protection layers covering the bit lines;

forming a conductive layer to be electrically connected to the semiconductor substrate by filling a gap between the side walls of the protection layers with a conductive material; and sequentially planarizing the conductive layer and the interlayer insulating layer to expose the top surface of each of the protection layers.

3. The method of claim 2, wherein the interlayer insulating layer covers two facing lateral sides of adjacent conductive contact pads, and each of the protection layers covers the other facing lateral sides of adjacent conductive contact pads.

4. The method of claim 2, wherein the step of sequentially planarizing the conductive layer and the interlayer insulating layer is performed by at least one of etch back and chemical mechanical polishing.

5. The method of claim 1, wherein the node supporting layer is formed of silicon oxide.

6. The method of claim 1, wherein the thickness of the node supporting layer accounts for about 20–40% of the thickness of the mold layer.

7. The method of claim 1, wherein the step of removing the mold layer stops at the surface of the etching stopper.

* * * * *